（12）United States Patent
Fitzpatrick et al.

(10) Patent No.: US 11,221,800 B2
(45) Date of Patent: Jan. 11, 2022

(54) ADAPTIVE AND/OR ITERATIVE OPERATIONS IN EXECUTING A READ COMMAND TO RETRIEVE DATA FROM MEMORY CELLS

(71) Applicant: Micron Technology, Inc., Boise, ID (US)

(72) Inventors: James Fitzpatrick, Laguna Niguel, CA (US); Sivagnanam Parthasarathy, Carlsbad, CA (US); Patrick Robert Khayat, San Diego, CA (US); AbdelHakim S. Alhussien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/807,059

(22) Filed: Mar. 2, 2020

(65) Prior Publication Data

US 2021/0271415 A1 Sep. 2, 2021

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01); *G11C 16/26* (2013.01); *G11C 16/0483* (2013.01)

(58) Field of Classification Search
CPC ............. G06F 11/3072; G06F 11/3476; G06F 13/1673; G06F 16/2358; G06F 1/10; G06F 1/12; G06F 1/14; G06F 2201/835; G06F 2201/86; G06F 3/0418; G06F 3/0611; G06F 3/0659; G06F 3/0683; G06F 8/35; G06F 8/41; G11C 29/56; G11C 13/00; G11C 11/56; G11C 16/34; G11C 13/02; G11C 15/00; G11C 16/04; G11C 16/08;
(Continued)

(56) References Cited

U.S. PATENT DOCUMENTS 5,864,504 A 1/1999 Tanzawa et al.
9,129,698 B2 9/2015 Zeng et al.
(Continued)

OTHER PUBLICATIONS

International Search Report and Written Opinion, PCT/US2020/063788, dated Mar. 26, 2021.

*Primary Examiner* — Thong Q Le
(74) *Attorney, Agent, or Firm* — Greenberg Traurig (57) ABSTRACT

A memory sub-system configured to adaptively and/or iteratively determine sub-operations of executing a read command to retrieve data from memory cells. For example, after receiving the read command from a processing device of a memory sub-system, a memory device starts an atomic operation of executing the read command in the memory device. The memory device can have one or more groups of memory cells formed on an integrated circuit die and a calibration circuit configured to measure signal and noise characteristics of memory cells in the memory device. During the atomic operation, the calibration circuit generates outputs, based on which a read manager of the memory sub-system identifies sub-operations to be performed in the atomic operation and/or decides to end the atomic operation.

17 Claims, 6 Drawing Sheets

(51) Int. Cl.
*G11C 16/26* (2006.01)
*G11C 16/04* (2006.01)

(58) Field of Classification Search
CPC ....... G11C 29/00; G11C 5/06; G11C 11/4063;
G11C 15/04; G11C 16/28; G11C 16/32;
G11C 29/02; G11C 29/04; G11C 29/44;
G11C 29/50; G11C 16/26; G11C 29/028;
G11C 16/0483; G11C 11/5642; G11C
2029/4402; G11C 29/025; G11C
29/12005; G11C 29/50008; G11C
2207/2254; G11C 29/46; G11C 11/5671;
G11C 16/10; G11C 16/3418; G11C
29/021; G11C 29/14; G11C 7/02; G11C
16/30; G11C 16/3495; G11C 29/022;
G11C 29/34; G11C 29/52
USPC ...................................... 365/49.15, 49.17, 63
See application file for complete search history.

(56) References Cited

U.S. PATENT DOCUMENTS

| | | |
|---|---|---|
| 9,947,401 B1 | 4/2018 | Navon et al. |
| 10,008,273 B2 | 6/2018 | Ray et al. |
| 10,347,344 B2 | 7/2019 | Malshe et al. |
| 11,029,890 B1 | 6/2021 | Parthasarathy et al. |
| 2008/0002468 A1 | 1/2008 | Hemink |
| 2008/0056008 A1 | 3/2008 | Aritome et al. |
| 2008/0192544 A1 | 8/2008 | Berman et al. |
| 2009/0063507 A1 | 3/2009 | Thompson |
| 2009/0144582 A1 | 6/2009 | Li et al. |
| 2009/0228701 A1 | 9/2009 | Lin |
| 2010/0027337 A1 | 2/2010 | Park |
| 2013/0070524 A1 | 3/2013 | Dutta et al. |
| 2014/0022853 A1 | 1/2014 | Choi et al. |
| 2014/0068384 A1 | 3/2014 | Kwak et al. |
| 2015/0124533 A1 | 5/2015 | Zeng et al. |
| 2016/0300609 A1 | 10/2016 | Han et al. |
| 2017/0061832 A1 | 3/2017 | Ghosh et al. |
| 2018/0254888 A1 | 9/2018 | Monahan et al. |
| 2018/0330098 A1 | 11/2018 | Wyseur |
| 2018/0373598 A1 | 12/2018 | Mondello et al. |
| 2019/0043590 A1 | 2/2019 | Besinga et al. |
| 2020/0201608 A1* | 6/2020 | Wallbaum ................. G06F 8/35 |
| 2020/0273840 A1 | 8/2020 | Elsherbini et al. |
| 2021/0181942 A1 | 6/2021 | Fitzpatrick et al. |

* cited by examiner

ADAPTIVE AND/OR ITERATIVE OPERATIONS IN EXECUTING A READ COMMAND TO RETRIEVE DATA FROM MEMORY CELLS

FIELD OF THE TECHNOLOGY

At least some embodiments disclosed herein relate to memory systems in general, and more particularly, but not limited to memory systems having adaptive and/or iterative operations in executing a read command to retrieve data from memory cells.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system having a read manager configured to adaptively and/or iterative identify, using signal and noise characteristics of memory cells, the sub-operations to be performed to retrieve data from memory cells during the execution of a read command. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundancy information to facilitate error detection and recovery. When data encoded with redundancy information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by adaptively and/or iteratively organize and perform sub-operations during the execution of a read command, based on the estimation/evaluation of the quality of encoded data that can be, or has been, retrieved from the memory cells. The sub-operations are organized dynamically as an atomic operation for the read command such that the overall performance of the execution of a read command is improved.

For example, the estimation/evaluation of the quality of encoded data can be based on the signal and noise characteristics of the memory cells measured during an attempt to retrieve the encoded data from the memory cells. Based on the estimation/evaluation, the memory sub-system can determine whether or not to skip certain sub-operations and/or whether or not to repeat certain sub-operations in the atomic operation in the execution of the read command.

For example, in response to a read command from a controller of the memory sub-system, a memory device of the memory sub-system performs an atomic operation for the command to read memory cells. The atomic operation can include sub-operations, such as measuring signal and noise characteristics, calculating optimized read parameters/voltages based on the measured signal and noise characteristics, evaluating the quality of data that can be retrieved based on the optimized read voltages, reading hard bit data using the optimized read voltages, reading soft bit data using read voltages having predetermined offsets from the optimized read parameters/voltages, decoding data retrieved from the memory cells, etc. The atomic operation is terminated with a response to the read command; and during the atomic operation of the read command, a memory device does not perform sub-operations for another read/write command.

Preferably, the sequence of sub-operations and/or their repetitions/iterations in the atomic operation are dynamically determined adaptively and/or iteratively based on the signal and noise characteristics measured during the atomic operation. For example, an atomic operation can include one iteration of calibration for one read command to retrieve data from a set of memory cells, and alternatively include multiple iterations of calibrations for another read command to retrieve data from another set of memory cells. One iteration of calibration is configured to identify an optimized read voltage within a limited range from an initial estimation. When a desired, optimized read voltage is too far away from the initial estimation, multiple iterations of calibration can be used to search for an optimized read voltage that is beyond the limited range from the initial estimation. Further, for example, an atomic operation can include no sub-operation of reading soft bit data for one read command to retrieve data from a set of memory cells, and alternatively include one sub-operation of reading soft bit data for another read command to retrieve data from another set of memory cells.

For example, after a calibration operation, the signal and noise characteristics measured during the calibration can indicate that the encoded data retrieved using the optimized read voltages obtained during the calibration will fail to decode. In such a situation, another calibration operation can be performed to further search for optimize read parameters that have associated signal and noise characteristics indicating that the encoded data retrieved via the further optimized read voltage can decode. The calibration operation can be performed automatically without reporting the result of the prior calibration and/or without reporting the encoded data retrieved based on the prior calibration. The calibration operations can be repeated iteratively with adjustments, up to a predetermined number of iterations, until the encoded data retrieved with the calibration(s) can decode successfully, or until the predetermined number of iterations has reached.

For example, the retrieval of certain information from the memory cells can be postponed, when the signal and noise characteristics indicate that no decoder can successful decode the encoded data retrieved using a set of calibrated read parameters (e.g., read voltages), and/or until the signal and noise characteristics indicate that the information is required in a decoder that can successfully decode the encoded data. For example, one decoder can be configured to decode using not only the hard bit data retrieved by applying optimized read voltages on the memory cells but also soft bit data retrieved by applying read voltages with a predetermined offset(s) from the optimized read voltages; however, another decoder can be configured to use only the hard bit data in decoding, without using the soft bit data. In general, hard bit data is the encoded data read from the memory cells at read voltages that are assumed to be optimized for reading (e.g., calculated based on the associated signal and noise characteristics); and soft bit data is the encoded data read at voltages having predetermined offsets from such read voltages that are assumed to be optimized for reading. The sub-operations of reading the soft bit data can be postponed until it is determined, based on the measured signal and noise characteristics, that such soft bit data is required for successful decoding.

In some instances, the memory sub-system can predict the time required to search for the read parameters for successful decoding. When the predicted time is longer than a threshold, the memory sub-system can postpone the search, terminate the atomic operation early, and thus suggest read retry. For example, when the predicted time for the search is longer than the amount of time for another read operation that does not require a search (and/or that does not require more than one calibration operation), or longer than the overhead for causing read retry, the memory sub-system can optionally delay the search until other pending read operations in a queue have been completed, or until the search has been postponed for up to a threshold amount of time. Thus, the impact of the delay associated with the search on the queued read operations can be reduced or minimized. However, in some systems, it is best to complete the calibration iterations for the current read before initiating the next read.

Optionally, the memory sub-system optimizes the performance of read operations by balancing the various costs associated with calibration, reading hard/soft bit data, decoding, power consumption, and/or latency.

For example, it can be predicted that successful decoding can be performed on the hard bit data and the soft bit data retrieved using the currently calibrated/optimized read voltages or, alternatively, performed on hard bit data with reduced errors after a further calibration without reading soft bit data. The memory sub-system can optimize its performance based on a determination of the latency difference between the two decoding options and/or a determination of the power consumption difference between the two decoding options; based on the differences, the memory sub-system can determine whether or not to perform the further calibration to optimize the latency and/or power consumption.

A predictive model can be generated through machine learning to estimate or evaluate the quality of data that can be retrieved from a set of memory cells using a set of read parameters. The read parameters can be calibrated via signal and noise characteristics measured for the memory cells.

For example, counts measured by calibration circuitry and/or its associated data can be used as the signal and noise characteristics for the predictive model. Further, such signal and noise characteristics can be measured for sub-regions in parallel to reduce the total time for measuring the signal and noise characteristics.

The predictive model can be trained to classify or predict the error rate in the raw data received from a set of memory cells. The classification can be generated by the predictive model based on signal and noise characteristics measured by the memory device during the reading of the raw data from the memory cells in the memory device. Based on the level of the error rate, the memory sub-system can selectively determine whether to perform a further calibration, to read hard bit data, to skip reading soft bit data, to perform decoding, etc. For example, the choice as to whether the following operation is to read soft bit data or re-calibration of the read thresholds can be determined by both the signal and noise information, and by estimates of whether he read thresholds have been fully optimized. When it is determined that the read voltages are optimal, and the bit error rate (BER) is too high (e.g., above a predetermined threshold), the memory device can decide to gather soft bit data. When the BER is high, but the read voltages have not found to be optimal, the memory device can further calibrate read voltages to get better hard bit data.

Figure 1:
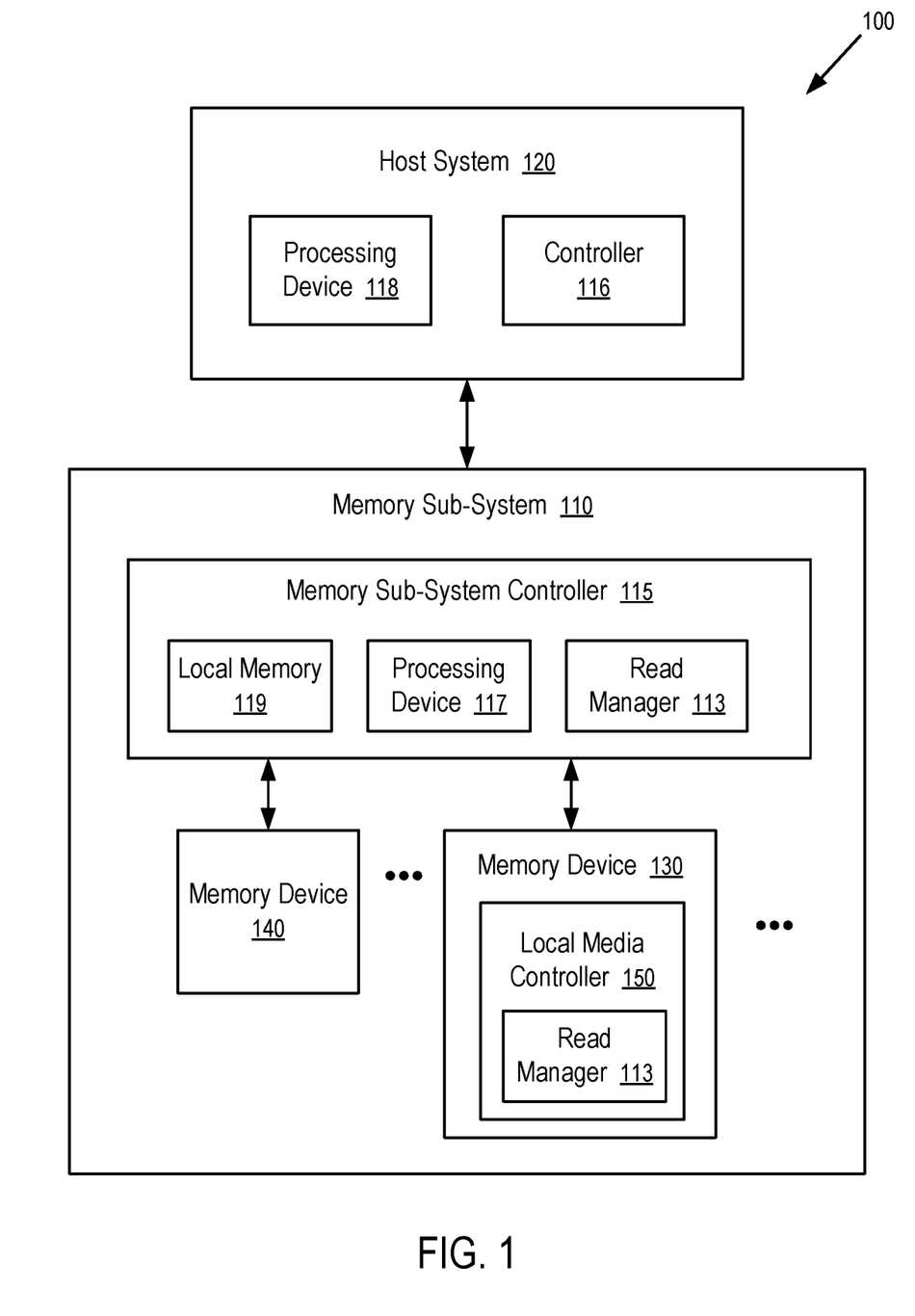
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130,140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to determine the sub-operations to be performed as an atomic operation for a read command, based on the signal and noise characteristics measured by the memory devices 130 for memory cells involved in the read command. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

The read manager 113 can receive signal and noise characteristics measured and provided by a memory device 130 for the memory cells in the memory device 130 and process the signal and noise characteristics to determine one or more sub-operations to be performed in an atomic operation in executing a read command. For example, based on the signal and noise characteristics, the read manager 113 can determine whether to retry a calibration to further search for optimized read voltages, whether to read hard bit data, whether to read soft bit data, whether to decode data retrieved from the memory cells, whether to report a read failure, whether to suggest a retry after a period of time, etc.

Figure 2:
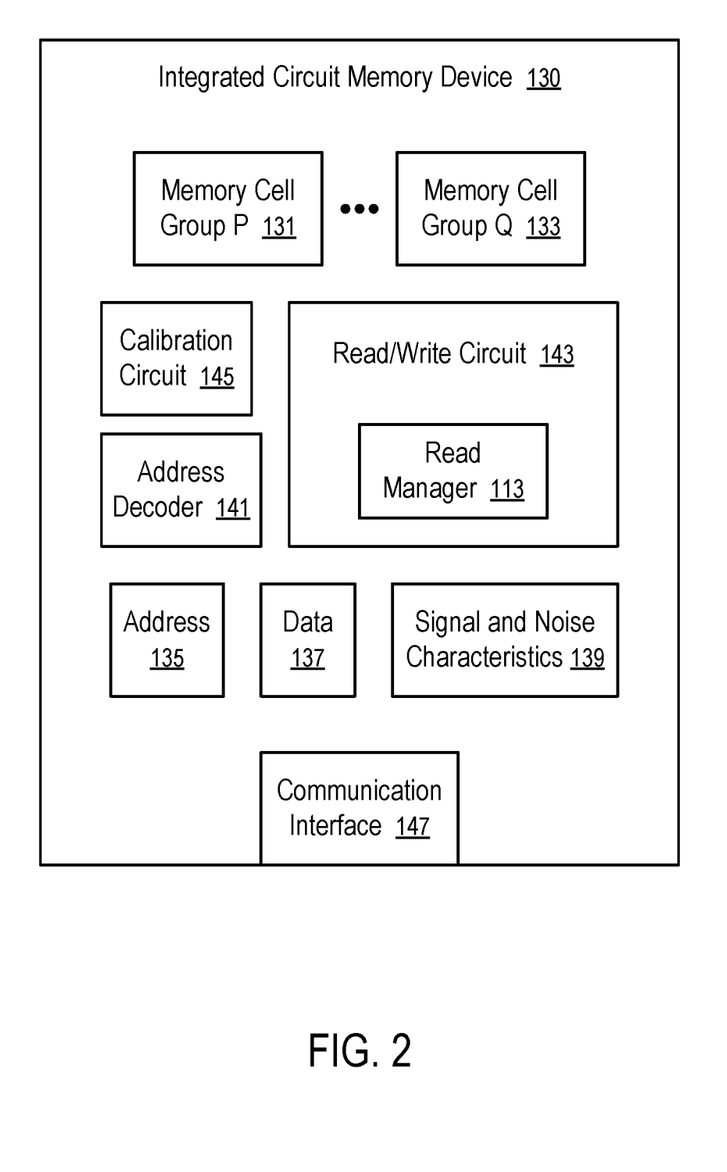
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive an address 135 from the controller 115 of a memory sub-system 110 and to provide the data 137 retrieved from the memory address 135. An address decoder 141 of the integrated circuit memory device 130 converts the address 135 into control signals to select the memory cells in the integrated circuit memory device 130; and a read/write circuit 143 of the integrated circuit memory device 130 performs operations to determine data stored in the addressed memory cells or to program the memory cells to have states corresponding to storing the data 137.

The integrated circuit memory device 130 has a calibration circuit 145 configured to determine measurements of signal and noise characteristics 139 of memory cells in a group (e.g., 131, . . . , or 133) and provide the signal and noise characteristics 139 to the controller 115 of a memory sub-system 110 via the communication interface 147.

In at least some embodiments, the calibration circuit 145 also provides, to the controller 115 via the communication interface 147, the signal and noise characteristics 139 measured to determine the read level offset value. In some embodiments, the read level offset value can be used to understand, quantify, or estimate the signal and noise characteristics 139. In other embodiments, the statistics of memory cells in a group or region that has a particular state at one or more test voltages can be provided as the signal and noise characteristics 139.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the data 137 from the address 135. Since the signal and noise characteristics 139 is measured as part of the operation to read the data 137 from the address 135, the signal and noise characteristics 139 can be used in the read manager 113 with reduced or no penalty on the latency in the execution of the command to read the data 137 from the address 135.

The read manager 113 of the memory sub-system 110 is configured to use the signal and noise characteristics 139 to selectively configure the sub-operations in an atomic operation of a read command to retrieve the data 137.

For example, the read manager 113 can use a predictive model, trained via machine learning, to predict the likelihood of the data 137 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the data 137 is transferred to a decoder, the read manager 113 uses the signal and noise characteristics 139 to predict the result of the test. Based on the predicted result of the test, a next sub-operation can be selected and performed.

For example, if the data 137 is predicted to decode using a low-power decoder that uses hard bit data without using the soft bit data, the read manager 113 can skip the sub-operation to read the soft bit data; and the read manager 113 provides the hard bit data, read from the memory cells using optimized read voltages calculated from the signal and noise characteristics 139, to the low-power decoder for decoding. For example, the low-power decoder can be implemented in the memory device 130. Alternatively, the low-power decoder can be implemented in the controller 115.

For example, if the data 137 is predicted to fail in decoding in the low-power decoder, but can be decoded using a high-power decoder that uses both hard bit data and soft bit data, the read manager 113 can decide to perform the sub-operation to read the soft bit data and provide the hard/soft bit data, read from the memory cells using optimized read voltages calculated from the signal and noise characteristics 139, to the high-power decoder for decoding. For example, the high-power decoder can be implemented in the controller 115. Alternatively, the high-power decoder can be implemented in the memory device 130.

For example, if the data 137 is predicted to fail in decoding in decoders available in the memory sub-system 110, the read manager 113 can decide skip reading at least part of the data 137 using the current calibration in some implementations; and the read manager 113 instructs the calibration circuit 145 to perform a modified calibration to obtain a new set of signal and noise characteristics 139, which can be further evaluated to determine the next sub-operation. In general, the data 137 can include hard bit data retrieved using optimized read voltages and optional soft bit data retrieved using read voltages that are a predetermined offset(s) way from the optimized read voltages. In some implementations, reading the hard bit data is in parallel with, or in connection with, the measuring of the signal and noise characteristics 139.

In one embodiment, an atomic operation of the memory device 130 is in response to a read command from the controller 115. Between the beginning and the ending of the atomic operation, the memory device 130 does not perform sub-operations for other read commands. A response to the controller 115 for the read command can be transmitted from the memory device 130 to the controller 115 after the termination of the atomic operation.

Optionally, the communication interface 147 of the memory device 130 allows the memory device to queue multiple read commands from the controller 115 for execution. When there are pending read commands in the queue, the read manager 113 can terminate an atomic operation for a read command before reaching a predetermined number of iterations in calibration, and before reaching a calibration where the retrieved data 137 can be decoded successfully. For example, when the read manager 113 predicts that the time for subsequent iterative calibrations is longer than a threshold, the read manager 113 can terminate the iterative process and provide priority to the processing of other pending read commands in the queue. The threshold can be a function of an overhead to perform read retry, and/or a time to execute a read command that does not require repeated calibrations in the memory device 130.

Optionally, the atomic operation of the memory device 130 for a read command can include optional, intermediate communications between the memory device 130 and the controller 115. For example, the memory device 130 can provide the signal and noise characteristics 139 to the controller 115 to determine the next sub-operation in the atomic operation. For example, the memory device 130 can suggest a re-calibration to the controller 115; and the read manager 113 of the controller 115 can determine whether or not to approve the re-calibration. In general, the read managers 113 in the controller 115 and in the memory device 130 cooperate with each other to determine the sub-operations performed for the atomic operation. Alternatively, the read manager 113 is implemented in the memory device 130; and the memory device 130 does not communicate with the controller 115 during the atomic operation. Alternatively, the read manager 113 is primarily implemented in the controller 115 to make decisions in selecting sub-operations.

Figure 3:
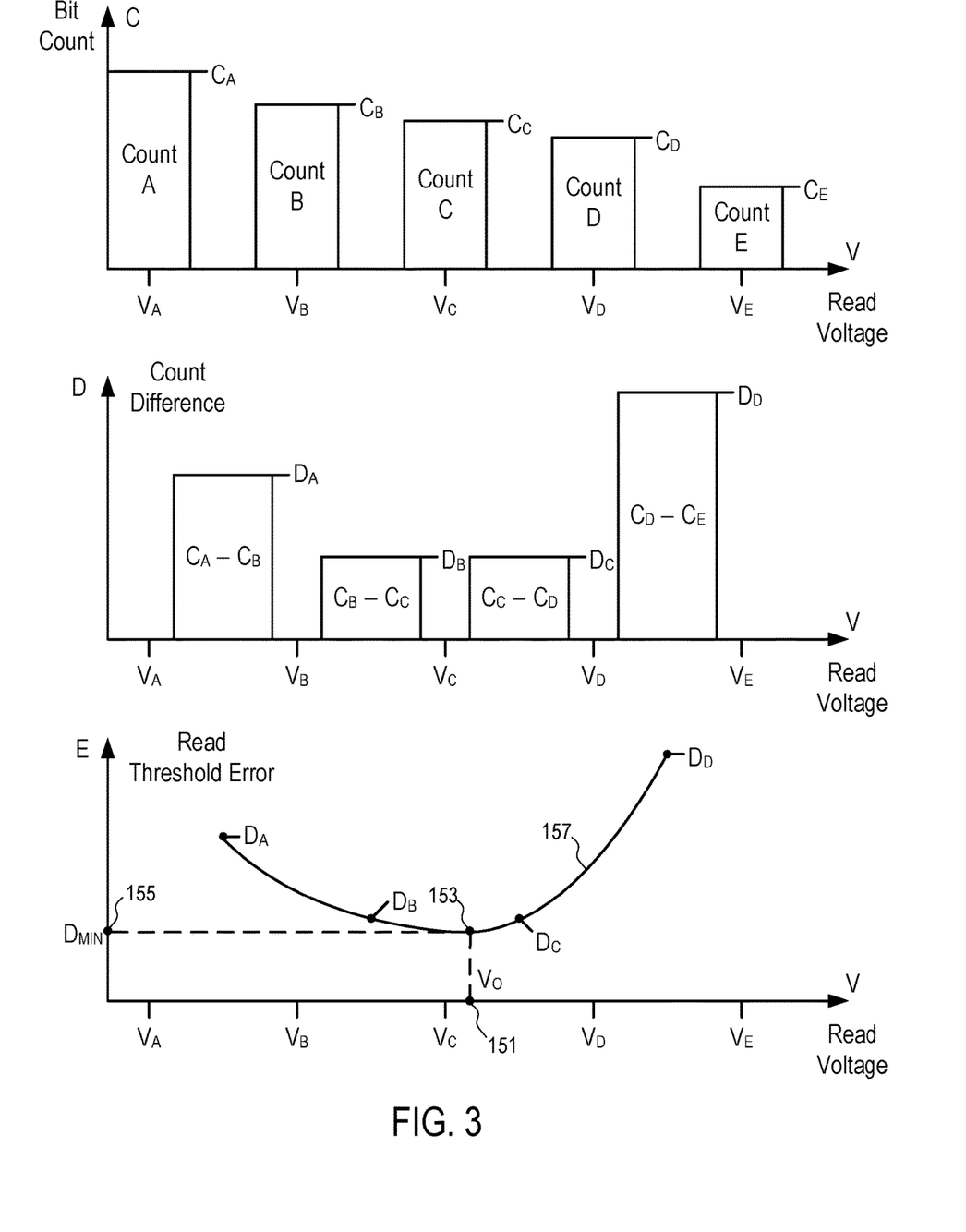
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, . . . , or 133) of memory cells.

Alternatively, the group (e.g., 131, . . . , or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data 137 from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$-$C_B$, which is an indication of read threshold error introduced by changing the read voltage from $V_A$ to $V_B$.

Similarly, $D_B = C_B - C_C$; $D_C = C_C - C_D$; and $D_D = C_D - C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data 137 from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimize read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data 137 according to the determined states.

During the read operation, the calibration circuit 145 of the memory device 130 generates the signal and noise characteristics 139. The data 137 and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data 137 from the memory cells at the address 135. The soft bit data in the data 137 can be obtained by reading the memory cells with read voltages that are a predetermined offset away from the optimized read voltage $V_O$. Alternatively, the memory device 130 uses the controller-specified read voltage provided in the read control parameter in reading the data 137.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 139 as part of enriched status response from the memory device 130.

Figure 4:
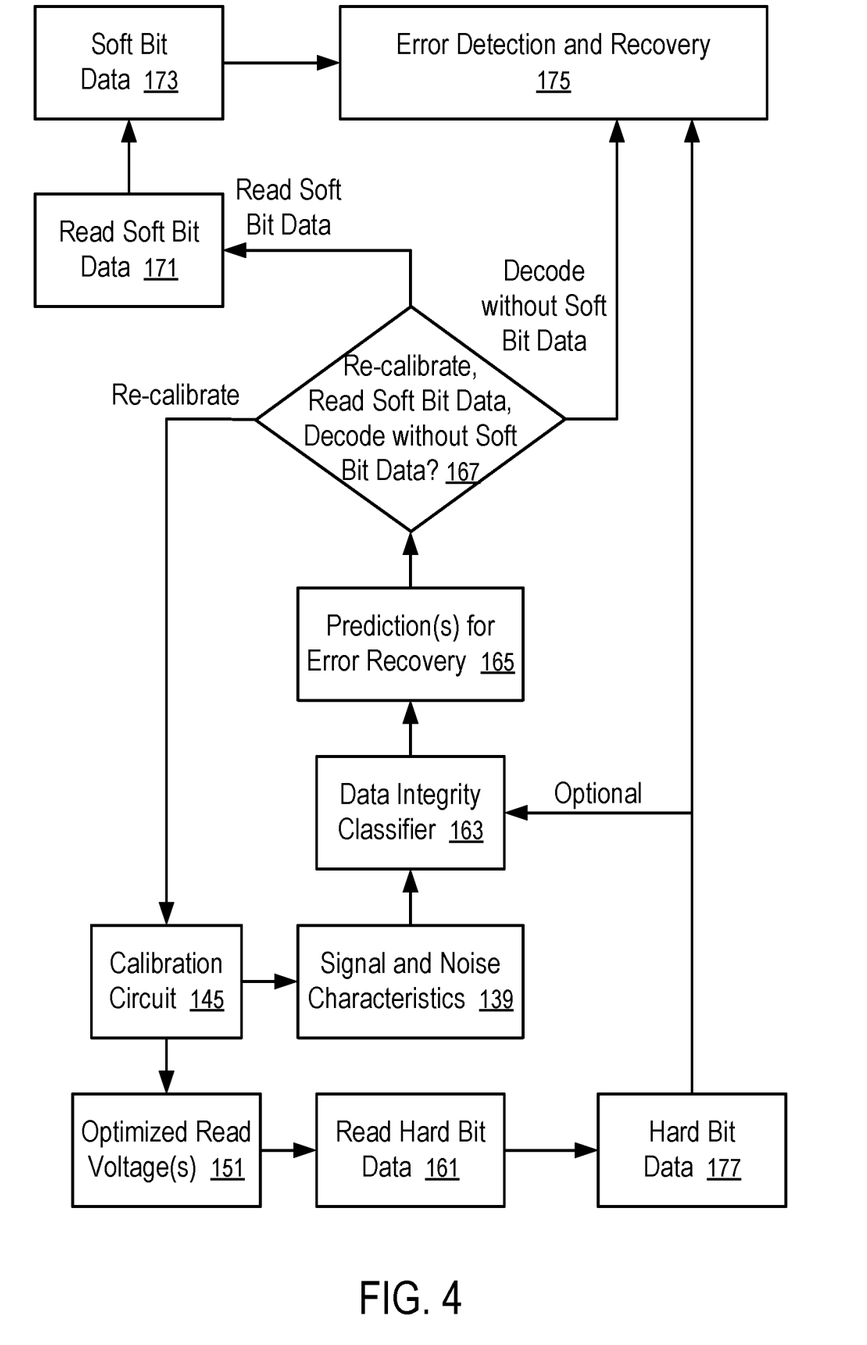
FIG. 4 illustrates adaptive and/or iterative operations to retrieve data from memory cells during the execution of a read command according to one embodiment.

FIG. 4 illustrates adaptive and/or iterative operations to retrieve data from memory cells during the execution of a read command according to one embodiment. For example, the adaptive and/or iterative operations of a read manager 113 according to FIG. 4 can be implemented in the controller 115 of the memory sub-system 110 of FIG. 1, and/or in an integrated circuit memory device 130 of FIG. 2, using the signal and noise characteristics 139 measured according to FIG. 3.

The sub-operations of FIG. 4 are performed in response to a read command. To execute the read command, the calibration circuit 145 of the memory device 130 measures the signal and noise characteristics 139 using voltages in the vicinity of the suspected location(s) of optimized read voltage(s). For example, the signal and noise characteristics 139 can include bit counts and/or bit differences at read voltages near expected value of the optimize read voltage illustrated in FIG. 3.

The calibration circuit 145 can determine an optimized read voltage(s) 151 from the measured signal and noise characteristics 139 (e.g., in a way as illustrated in FIG. 3). The read/write circuit 143 of the memory device 130 can use the optimized read voltage(s) to read 161 the hard bit data 177. For example, the read/write circuit 143 applies the optimized read voltage(s) to the memory cells at the address identified by the read command, and determine the states of the memory cells and thus the corresponding hard bit data 177.

In general, the data 137 retrieved from the memory cells using the optimized read voltages 151 includes at least the hard bit data 177 and can have errors. The data 137 can optionally further include soft bit data 173 read 171 at a predetermined offset(s) from the optimized read voltage(s) 151.

A data integrity classifier 163 determines a prediction(s) 165 for the results of error recovery for the data 137 retrieved from the memory cells according to the optimized read voltages 151.

For example, the data 137 retrieved from the memory cells of the memory device is in an encoded format that allows error detection and recovery 175 (e.g., using techniques such as Error Correction Code (ECC), Low-Density Parity-Check (LDPC) code). The signal and noise characteristics 139 can be provided as input to the data integrity classifier 163 to evaluate the likelihood of the data 137 having too many errors for success decoding the data 137 by some or all the processing paths/modules/options in error detection and recovery 175.

For example, the memory sub-system 110 can include a low power ECC, a full power ECC, an LDPC decoder that does not use soft bit data, and/or an LDPC decoder that uses both hard bit data and soft bit data in decoding. In general, available paths/modules/options for decoding the data 137 in a memory sub-system 110 are not limited to such the examples; different processing paths/modules/options can be implemented; and the different processing paths/modules/options have different power consumption levels, different capabilities in recovering error-free original/non-encoded data from the retrieve raw data 137, and/or different processing latency.

The data integrity classifier 163 can be trained (e.g., through machine learning) to predict the likelihood of data integrity failure of the data 137 based on the associated signal and noise characteristics 139.

For example, the likelihood of data integrity failure of the data 137 can be in the form of an estimated bit error rate in the data 137.

For example, the likelihood of data integrity failure of the data 137 can be in the form of a prediction of whether the data 137 can be successfully decoded (e.g., via ECC or LDPC) by any of the processing paths/modules/options for error detection and recovery 175 and if so, which of the processing paths/modules/options is or are predicted to be able to successfully decode the data 137 having the associated signal and noise characteristics 139.

For example, some of the processing paths/modules/options are implemented in the memory device 130; and some of the processing paths/modules/options are implemented in the controller 115.

Based on the predicted likelihood of data integrity failure of the data 137, the read manager 113 can select one of the processing paths/modules/options with reduced power consumption, reduced processing latency, and/or a high probability of success in decoding.

In some embodiments, the data integrity classifier 163 is trained to directly provide a prediction of an optimized processing path/module (e.g., 171, 173, 175, or 177) to process the encoded data 137 retrieved from the memory cells of the memory device 130.

In some embodiments, the data integrity classifier 163 is trained to provide a prediction of a prioritized list of processing paths/modules/options (e.g., 171, 173, 175, and/or 177) that can successfully decode the encoded data 137. Further, the data integrity classifier 163 can further provide an indication of the confidence levels of the selected listed processing paths/modules/options (e.g., 171, 173, 175, and/or 177) in successfully decoding the data 137.

Optionally, the data integrity classifier 163 can also be trained to evaluate the confidence levels of the prediction(s) 165; and the confidence levels can be used in the selection of an option from the available paths/modules/options in error detection and recovery 175.

Based on the prediction(s) 165, the read manager 113 determines 167 whether to re-calibrate the read thresholds, or to read 171 soft bit data 173, or to decode hard bit data 177 without soft bit data 173. When the read manager 113 determines 167 that the data 137 retrieved or retrievable according to the optimized read voltage 151 is going to fail in all decoders in error recovery 175 implemented in the memory sub-system 110, the read manager 113 instructs the calibration circuit 145 to perform a further calibration (e.g., based on a modified identification of a neighborhood to search for the optimize voltage(s) 151). The iterative calibrations can be performed up to a predetermined threshold of iterations, or until at least one decoder in the memory sub-system 110 is predicted to be able to decode the data 137 retrieved/retrievable based on the calibrated/optimized read voltages. In general, such data 137 for the decoders implemented in the memory sub-system 110 can include hard bit data 177 read using the optimized read voltages, and optionally soft bit data 173 read using read voltages at a predetermined offset(s) away from the optimized read voltages.

After the predetermined threshold of iterations, if the predictions 165 indicate that the data retrieved or retrievable from the memory cells will fail to decode, the memory device 130 can report a failure for the read command.

Optionally, the read manager 113 executes the read 161 of the hard bit data 177 only after the predictions 165 indicate that the data 137 can decode using at least one decoder implemented in the memory sub-system 110.

When the predictions 165 indicate that data 137 can decode using at least one decoder implemented in the memory sub-system 110, the read manager 113 further determines whether soft bit data 173 is needed for a selected processing paths/modules/options of error detection and recovery 175; and if so, the read manager 113 executes the read 171 of the soft bit data 171 by reading the memory cells using read voltages that are at the predetermined offset(s) away from the optimized read voltage(s) 151.

In general, the read manager 113 can be implemented in the memory device 130 and/or in the controller 115 of the memory sub-system 110. For example, one read manager 113 can be implemented in the memory device 130 and customized for scheduling sub-operations in the memory device 130 during the execution of a read command; and another read manager 113 can be implemented in the controller 115 and customized for scheduling sub-operations for the execution of the read command through communications between the memory device 130 and the controller 115. The read manager 113 implemented in the memory device 130 can schedule sub-operations for the read command without communicating with the controller 115. Optionally, no read manager is implemented in the controller 115.

The read manager 113 implemented in the controller 115 can use not only the signal and noise characteristics 139 received from the memory device 130 for the data 137 but also other information that may not be available in the memory device 130, such as charge loss, read disturb, cross-temperature effect, program/erase, data retention, etc. The read manager 113 implemented in the controller 115 and the read manager 113 implemented in the memory device 130 can have different complexity, and/or different levels of accuracy in their predictions. The read manager 113 implemented in the controller 115 and the read manager 113 implemented in the memory device 130 can communicate with each other to collaboratively schedule sub-operations for the execution of the read command.

Optionally, the memory device 130 provides its prediction 161 to the controller 115; and the controller 115 uses the prediction 161 generated by the memory device 130 and/or other information to select a path/module/option for decoding the data 137. Alternatively, the controller 115 can be independent from the memory device 130 in selecting a path/module/option for decoding the data 137.

Some of the paths/modules/options of the error detection and recovery 175 can be implemented in the memory device 130. When a path/module/option implemented in the memory device 130 is selected/scheduled for the execution of the read command, the execution of the path/module/option can be scheduled as part of the atomic operation of executing the read command in the memory device 130.

The processing logic of at least a portion of the error detection and recovery 175 and the read manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A read manager 113 can include a data integrity classifier 163. When the data integrity classifier 163 is implemented in the memory device 130, the output of the data integrity classifier 163 can be used in controlling the retrieval of the data 137 (e.g., the hard bit data 177 and/or the soft bit data 173).

For example, when the output of the data integrity classifier 163 indicates that the encoded data 137 is likely to be decoded using a decoder (e.g., 177) that uses soft bit data, the read manager 113 of the memory device 130 can automatically further read 171 the soft bit data 173 in addition to reading 161 the hard bit data 177. However, if the data integrity classifier indicates that the hard bit data 177 can be decoded using a decoder (e.g., 175) that does not require soft bit data 173 as input, the read manager 113 of the memory device 130 can skip the sub-operations to read 171 soft bit data 173 and/or the operations to transmit the soft bit data to the controller 115.

For example, when the output of the data integrity classifier 163 indicates that none of the available paths/modules/options in the memory sub-system 110 is likely to be successful in decoding the data 137 (e.g., including the hard bit data 177 and the soft bit data 173), the read manager 113 of the memory device 130 can automatically schedule a sub-option of read-retry to search for an improved read voltage(s) as part of the atomic operation of executing the read command in the memory device 130. Further, the read manager 113 of the memory device 130 can optionally skip reading 161 the hard bit data 177 when the output of the data integrity classifier 163 indicates that none of the available paths/modules/options in the error detection and recovery 175 is likely to be successful in decoding the data 137.

Figure 5:
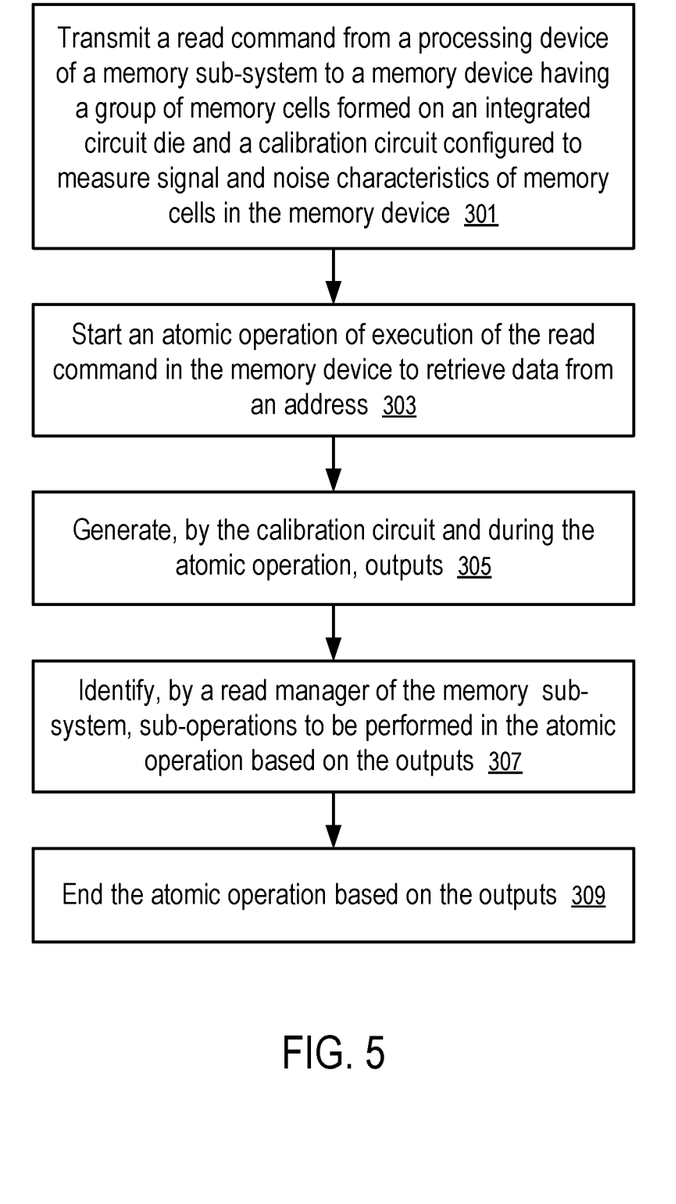
FIG. 5 shows a method of control operations to retrieve data from memory cells during the execution of a read command according to one embodiment.

FIG. 5 shows a method of control operations to retrieve data from memory cells during the execution of a read command according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with a memory device of FIG. 2 and signal noise characteristics illustrated in FIG. 3 with the operations illustrated in FIG. 4.

At block 301, a read command is transmitted from a processing device 117 of a memory sub-system 110 to a memory device 130. The memory device 130 can have a group of memory cells (e.g., 131 or 133) formed on an integrated circuit die and a calibration circuit 145 configured to measure signal and noise characteristics 139 of memory cells in the memory device 130.

At block 303, the memory device 130 starts an atomic operation of execution of the read command to retrieve data from an address.

During the execution of the atomic operation, at block 305, the calibration circuit 145 of the memory device 130 generates outputs. The outputs can include the measured signal and noise characteristics 139 and the read voltage $V_O$ optimized based on the measured signal and noise characteristics 139.

At block 307, a read manager of the memory sub-system 110 identifies sub-operations to be performed in the atomic operation based on the outputs of the calibration circuit 145.

At block 309, the memory sub-system 110 ends the atomic operation based on the outputs of the calibration circuit 145.

For example, during the atomic operation, the calibration circuit 145 can perform one or more calibrations. The number of iterations of calibration can be based on the outputs of the calibration circuit 145. After the calibration circuit 145 performs a current calibration to measure first signal and noise characteristics 139 of a group of memory cells (e.g., 131 or 133) identified by an address of the read command, the memory device 130 is configured to determine (e.g., 167), based on the first signal and noise characteristics 139, whether or not to perform a further calibration to measure second signal and noise characteristics of the group of memory cells.

For example, during the atomic operation, the memory device 130 is configured to determine (e.g., 167), based on the first signal and noise characteristics 139, whether or not to read (e.g., 161 or 171) the group of memory cells using a read voltage optimized using the first signal and noise characteristics 139.

The sub-operations of the atomic operation can be identified by iteratively calibrate a read voltage using the signal and noise characteristics 139 of memory cells measured by the calibration circuit 145. Whether or not to perform a further calibration can be based on the signal and noise characteristics 139 of the group of memory cells measured in the current calibration.

The atomic operation can be terminated in response to reaching a predetermined threshold number of iterations, or in response to a determination that an estimated time for iterative calibration is longer than a threshold when a command queue in the memory device has other pending read commands.

For example, during the atomic operation, the calibration circuit 145 performs a first calibration to measure first signal and noise characteristics of a group of memory cells identified by the read command using an address. Based on the first signal and noise characteristics, the read manager determines whether or not to perform a second calibration to measure second signal and noise characteristics of the group of memory cells identified by the address. The calibration circuit 145 can calculate or determine a first read voltage optimized according to the first signal and noise characteristics and a second read voltage that is at a predetermined offset from the first read voltage. Based on the first signal and noise characteristics, the read manager 113 is configured to determine whether or not to read the group of memory cells through applying the first read voltage to obtain hard bit data 177 from the group of memory cells. Similarly, based on the first signal and noise characteristics, the read manager 113 is configured to determine whether or not to read the group of memory cells through applying the second read voltage to obtain soft bit data 173 from the group of memory cells.

For example, the read manager 113 can include a data integrity classifier 163. During the atomic operation, the data integrity classifier is configured to determine, based on the first signal and noise characteristics 139, a classification of an error rate of data 137 retrievable from the group of memory cells based on the first read voltage; and whether or not to apply the first read voltage to read the group of memory cells for the hard bit data 177, and/or whether or not to apply the second read voltage to read the group of memory cells for the soft bit data 173, can be based on the classification.

Optionally, during the atomic operation, the read manager 113 is configured to decide, based on the first signal and noise characteristics 139, to decode data 137 retrieved from the group of memory cells through applying the first read voltage; and the memory device can be configured to decode the data 137 as part of the atomic operation. For example, when the bit error rate of the data 137 is within a predetermined range, the memory device 130 uses its optimal decoder to decode the data 137; and when the bit error rate of the data 137 is within another predetermined range, the memory device 130 provides the data 137 for decoding by the controller 115 of the memory sub-system 110.

For example, the memory device 130 can be enclosed within an integrated circuit device; and the read command is received from the processing device 117 of the controller 115 of the memory sub-system 110.

The atomic operation can be configured such that during the atomic operation, the memory device 130 and the processing device 117 do not communicate with each other regarding the execution of the read command.

For example, the read manager can be implemented in the memory device 130; and the read manager 113 does not provide any response to the processing device 117 and/or the controller 115 about the read command until the end of the atomic operation.

Alternatively, at least a portion of the read manager 113 is implemented via the processing device 117 and/or the controller 115.

Optionally, the read manager 113 can be configured to decide to end the atomic operation based on a status of a read command queue in the memory device and/or a predicted time to identify, through iterative calibration, an optimized read voltage such that a decoder of the memory sub-system is able to decode the data 137 retrieved from the group of memory cells (e.g., 131 or 133) using the optimized read voltage.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform the methods discussed above.

Figure 6:
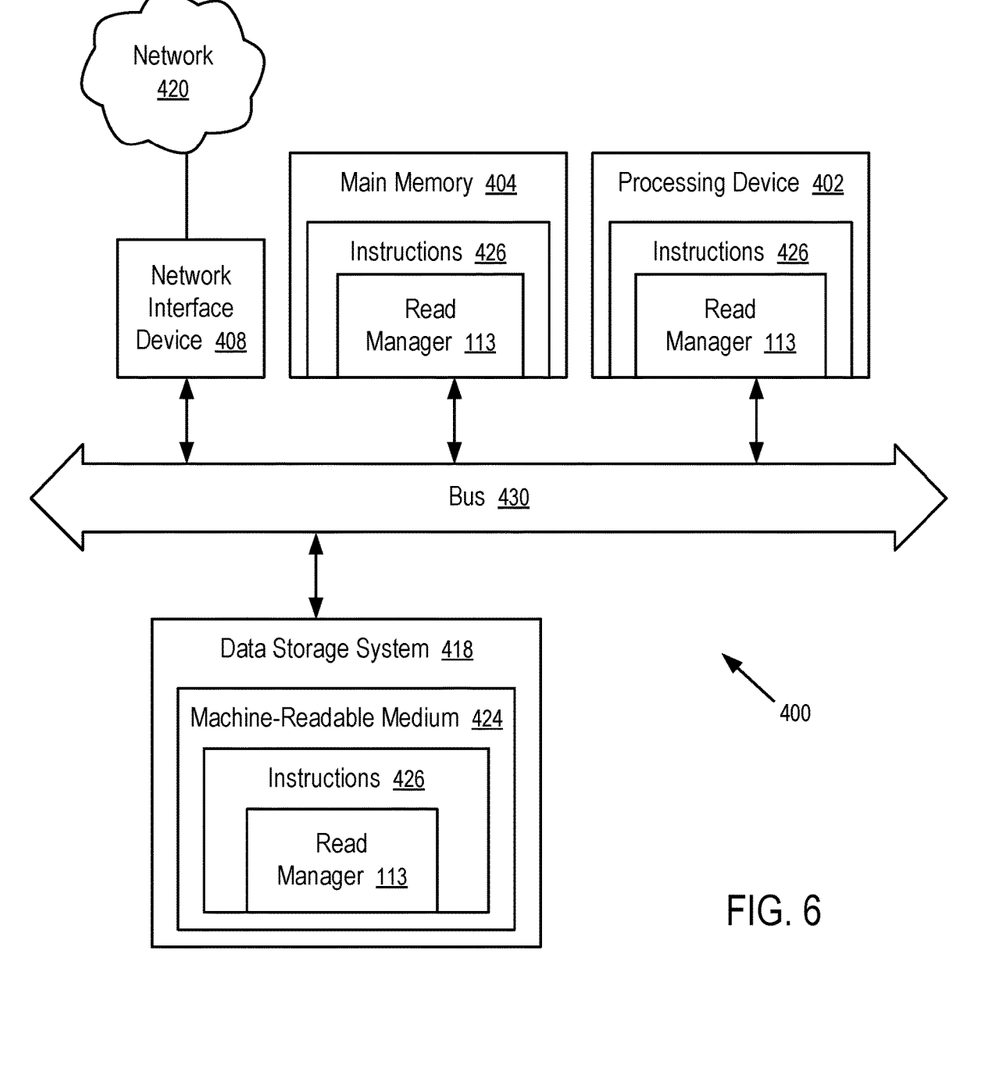
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-5). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
   a processing device; and
   at least one memory device, the memory device having:
      a group of memory cells formed on an integrated circuit die; and
      a calibration circuit configured to measure signal and noise characteristics of memory cells in the memory device;
   wherein during execution of a read command in the memory device to retrieve data from an address, the memory sub-system is configured to perform an atomic operation;
   wherein the memory sub-system includes a read manager configured to identify sub-operations to be performed in the atomic operation based on outputs generated by the calibration circuit during the atomic operation; and
   wherein, during the atomic operation:
      the calibration circuit performs a first calibration to measure first signal and noise characteristics of the group of memory cells identified by the address; and
      based on the first signal and noise characteristics, the read manager is configured to determine whether or not to perform a second calibration to measure second signal and noise characteristics of the group of memory cells identified by the address.

2. The memory sub-system of claim 1, wherein, during the atomic operation, the read manager is configured to iteratively determine whether or not to perform a further calibration based on signal and noise characteristics of the group of memory cells measured in a current calibration.

3. The memory sub-system of claim 1, wherein, during the atomic operation:
   the calibration circuit determines a first read voltage optimized according to the first signal and noise characteristics; and
   based on the first signal and noise characteristics, the read manager is configured to determine whether or not to read the group of memory cells through applying the first read voltage to obtain hard bit data from the group of memory cells.

4. The memory sub-system of claim 3, wherein, during the atomic operation:
the calibration circuit determines a second read voltage at a predetermined offset from the first read voltage; and
based on the first signal and noise characteristics, the read manager is configured to determine whether or not to read the group of memory cells through applying the second read voltage to obtain soft bit data from the group of memory cells.

5. The memory sub-system of claim 4, wherein, during the atomic operation, the read manager is configured to determine, based on the first signal and noise characteristics, a classification of an error rate of data retrievable from the group of memory cells based on the first read voltage; and whether or not to apply the first read voltage to read the group of memory cells for the hard bit data is based on the classification.

6. The memory sub-system of claim 5, wherein whether or not to apply the second read voltage to read the group of memory cells for the soft bit data is based on the classification.

7. The memory sub-system of claim 3, wherein, during the atomic operation, the read manager is configured to decide, based on the first signal and noise characteristics, to decode first data retrieved from the group of memory cells through applying the first read voltage; and
the memory device is configured to decode the first data as part of the atomic operation.

8. The memory sub-system of claim 7, wherein the memory device is enclosed within an integrated circuit device; and the read command is received from the processing device.

9. The memory sub-system of claim 8, wherein during the atomic operation, the memory device and the processing device do not communicate with each other regarding the execution of the read command.

10. The memory sub-system of claim 8, wherein at least a portion of the read manager is implemented via the processing device.

11. The memory sub-system of claim 8, wherein the read manager is implemented in the memory device; and the read manager provides no response about the read command until an end of the atomic operation.

12. The memory sub-system of claim 11, wherein the read manager is configured to decide to end the atomic operation based on a status of a read command queue in the memory device.

13. The memory sub-system of claim 12, wherein a decision to end the atomic operation is further based on a predicted time to identify, through iterative calibration, an optimized read voltage such that a decoder of the memory sub-system is able to decode data retrieved from the group of memory cells using the optimized read voltage.

14. A method, comprising:
transmitting a read command from a processing device of a memory sub-system to a memory device, the memory device having:
a group of memory cells formed on an integrated circuit die; and
a calibration circuit configured to measure signal and noise characteristics of memory cells in the memory device;
starting an atomic operation of execution of the read command in the memory device to retrieve data from an address;
generating, by the calibration circuit and during the atomic operation, outputs;
identifying, by a read manager of the memory sub-system, sub-operations to be performed in the atomic operation based on the outputs; and
ending the atomic operation based on the outputs, wherein the sub-operations are identified by iteratively calibrate a read voltage using the signal and noise characteristics of memory cells measured by the calibration circuit; wherein whether or not to perform a further calibration is based on signal and noise characteristics of the group of memory cells measured in a current calibration.

15. The method of claim 14, wherein the atomic operation is terminated in response to a determination that a time for iterative calibration is longer than a threshold and a command queue in the memory device has pending read commands.

16. A memory device, comprising:
an integrated circuit package enclosing the memory device;
a plurality of groups of memory cells formed on at least one integrated circuit die; and
a calibration circuit configured to measure signal and noise characteristics of memory cells in the memory device;
wherein the memory device is configured to identify, based on the signal and noise characteristics, sub-operations to be performed in an atomic operation of executing a read command received in the memory device; and
wherein during the atomic operation, after the calibration circuit performs a current calibration to measure first signal and noise characteristics of a group of memory cells identified by an address of the read command, the memory device is configured to determine, based on the first signal and noise characteristics, whether or not to perform a further calibration to measure second signal and noise characteristics of the group of memory cells.

17. The memory device of claim 16, wherein during the atomic operation, the memory device is configured to determine, based on the first signal and noise characteristics, whether or not to read the group of memory cells using a read voltage optimized using the first signal and noise characteristics.

* * * * *